(12) United States Patent
Koh

(10) Patent No.: US 7,033,875 B2
(45) Date of Patent: Apr. 25, 2006

(54) MOS TRANSISTOR AND FABRICATION METHOD THEREOF

(75) Inventor: Kwan-Ju Koh, Bucheon (KR)

(73) Assignee: DongbuAnam Semiconductor Inc., Seoul (KR)

( * ) Notice: Subject to any disclaimer, the term of this patent is extended or adjusted under 35 U.S.C. 154(b) by 0 days.

(21) Appl. No.: 10/911,930

(22) Filed: Aug. 4, 2004

(65) Prior Publication Data
US 2005/0029682 A1 Feb. 10, 2005

(30) Foreign Application Priority Data
Aug. 7, 2003 (KR) .................... 10-2003-0054651

(51) Int. Cl.
*H01L 21/336* (2006.01)
(52) U.S. Cl. ...................... 438/197; 257/408
(58) Field of Classification Search ........... 438/197, 438/300, 301, 303, 305, 306; 257/288, 344, 257/347, 408
See application file for complete search history.

(56) References Cited

U.S. PATENT DOCUMENTS

| 5,627,097 | A |   | 5/1997 | Venkatesan et al. |
| 5,817,562 | A | * | 10/1998 | Chang et al. ............... 438/305 |
| 5,872,039 | A |   | 2/1999 | Imai |
| 6,104,063 | A | * | 8/2000 | Fulford et al. .............. 257/344 |

* cited by examiner

*Primary Examiner*—David Vu
(74) *Attorney, Agent, or Firm*—Andrew D. Fortney

(57) ABSTRACT

A MOS transistor and a method for fabricating the MOS transistor. The present invention enables implementation of a stable semiconductor device that is capable of protecting against leakage current generation by improving the "LDD effect" and securing a large process margin by adjusting an "off" current. The method for fabricating a MOS transistor includes placing or arranging an epitaxial layer between a silicon wafer and a gate electrode, and forming three impurity regions, including a very low concentration impurity region, and a low concentration impurity region and a high concentration impurity region (source and drain region).

13 Claims, 3 Drawing Sheets

MOS TRANSISTOR AND FABRICATION METHOD THEREOF

CLAIM OF PRIORITY

This application makes reference to, incorporates the same herein by reference, and claims all benefits accruing under 35 U.S.C. §119 from an application entitled MOS TRANSISTOR AND FABRICATION METHOD THEREOF, filed in the Korean Industrial Property Office on Aug. 7, 2003 and there duly assigned Ser. No. 2003-54651.

BACKGROUND OF THE INVENTION (a) Field of the Invention

The present invention relates to a MOS transistor and a method for fabricating a semiconductor device, and in particular, to a method for fabricating a MOS transistor.

(b) Description of the Related Art

The MOS transistor, which is a field effect transistor (FET), has source and drain regions formed in a semiconductor substrate and a gate oxide layer and a gate formed over a channel generally defined by the source/drain regions. In this MOS transistor structure, metal wires are connected to the source, the drain, and the gate electrodes such that the transistor operates by applying electric signals thereto. A method for fabricating the above structured MOS transistor will be explained hereinbelow.

Firstly, a lightly doped drain (LDD) is formed by depositing a gate oxide layer and a polysilicon layer sequentially on the surface of the active region of the silicon wafer, and injecting or implanting (hereinafter, "injecting") a P-type or N-type dopant into the silicon wafer of the device region using a gate made from the polysilicon as a mask, and forming spacers on both sides of the polysilicon gate. Next, the source/drain regions are formed by injecting a high concentration of dopant ions of a type identical with that of the LDD into the device region of the silicon wafer.

The gate CD (critical dimension) of MOS transistors fabricated in the above-explained manner has recently tended to decrease in order to increase the density and/or integrality of the devices. However, the decrease of the gate CD requires shortening a length of the channel. In particular, the channel length has become much shorter between the source and drain regions in which the impurity ions are injected, due to diffusion of the impurity ions. If the channel length is excessively shortened as such, a leakage current is generated even with the LDD structure, adjustment of an off-current becomes difficult with direct current, and a breakdown occurs due to the narrowed depletion region between the source and drain. A leakage current is also generated when the carriers move from the source to the drain through the channel at a voltage lower than an operational voltage.

Accordingly, needs for a MOS transistor having a novel structure which is advantageous for miniaturizing the device while at the same time reducing leakage current, and a method for fabricating such a transistor have been felt.

U.S. Pat. No. 5,627,097 discloses a technique for forming the channel region using an epitaxial layer, and U.S. Pat. No. 5,872,039 discloses a technique for reducing the diffusion regions of the source/drain terminals.

SUMMARY OF THE INVENTION

The present invention has been made in an effort to solve the above problems, and it is an object of the present invention to provide a MOS transistor and a method for fabricating the same which is capable of reducing leakage current and securing or providing a relatively large process margin.

It is another object of the present invention to provide a MOS transistor and a fabrication method thereof that are capable of implementing a stable device with a gate CD identical with conventional devices.

In one aspect of the present invention, an epitaxial layer is arranged between a silicon wafer and a gate electrode, and an impurity region is formed with three portions: a very low concentration impurity region formed in the epitaxial layer, a low concentration impurity region, and a high concentration impurity region (source and drain region) formed in the silicon wafer.

The MOS transistor fabrication method includes the steps of forming low impurity concentration regions in a semiconductor substrate, sequentially forming an epitaxial layer and a gate oxide layer on the semiconductor substrate between the low impurity concentration regions, forming a gate with a CD narrower than that of the epitaxial layer, forming a very low concentration impurity region in the epitaxial layer using the gate as a mask, forming a spacer on sidewalls of the gate and epitaxial layer, and forming source/drain region(s) in the semiconductor substrate using the spacer as a mask.

Preferably, the step of forming low impurity concentration regions includes forming a photoresist pattern on the semiconductor substrate, injecting the impurity into the semiconductor substrate at a low concentration using the photoresist pattern as a mask, and removing the photoresist pattern.

Preferably, the step of forming the epitaxial layer and the gate oxide layer includes forming a sacrificial layer on the semiconductor substrate, forming a window in the sacrificial layer to expose the semiconductor substrate between the low impurity concentration regions, and forming the epitaxial layer and gate oxide layer on the exposed semiconductor substrate. In a further preferred embodiment, the sacrificial layer is removed after the very low concentration impurity region is formed.

Preferably, the sacrificial layer comprises a nitride layer (e.g., silicon nitride or silicon oxynitride) which may have a thickness in the range of 100–1000 Å, and which may be removed by wet etching.

Preferably, the epitaxial layer has a thickness in the range of 100–500 Å.

Preferably, the step of forming the very low concentration impurity region further includes forming a protection layer on the gate before injecting the impurity ions at a very low concentration into the epitaxial layer.

Preferably, the spacer comprises a nitride layer, and the method further comprises forming a cap oxide layer on an entire surface of the semiconductor substrate, including the gate, before forming the spacer.

DETAILED DESCRIPTION OF THE PREFERRED EMBODIMENTS

A MOS transistor and a fabrication method thereof according to a preferred embodiment of the present invention will be described hereinafter with reference to the accompanying drawings.

Figure 2:
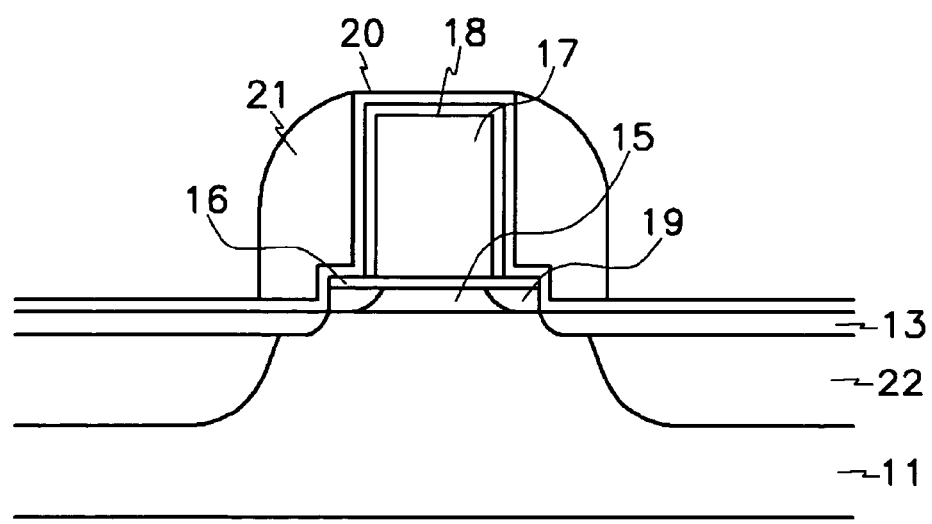
FIG. 2 is a cross sectional view showing the MOS transistor fabricated by the MOS transistor fabrication method depicted in FIG. 1A to FIG. 1D.

FIG. 2 shows a preferred embodiment of the present MOS transistor, including an epitaxial layer 15 on a semiconductor substrate 11, a gate oxide layer 16 on the epitaxial layer 15, a gate 17 on the gate oxide layer 16 having a width that is narrower than that of the epitaxial layer 15, and a pair of spacers 21 on sidewalls of the gate 17 and epitaxial layer 15. Also, the source/drain impurity regions of the MOS transistor include very low impurity concentration regions 19 (formed by injecting an impurity into the epitaxial layer 15 outward of [i.e., not covered by] the gate 17), low impurity concentration regions 13 (formed by injecting the impurity into substrate 11 at a concentration a little greater than that of the very low impurity concentration region 19), and source/drain regions 22 having an impurity concentration greater than that of the low impurity concentration region 13 (formed outward of the spacer 21 in the semiconductor substrate 11).

The semiconductor substrate 11 is a silicon wafer and the epitaxial layer 15 preferably has a thickness in the range of 100–500 Å. Also, the gate 17 preferably comprises or consists essentially of polycrystalline silicon (and may further comprise a metal silicide layer thereon), and the spacer 21 preferably comprises or consists essentially of a nitride layer.

A protection layer 18 such as an oxide layer having a thickness of, e.g., from 50 to 300 Å can be formed on the gate 17, and a cap oxide layer 20 having a thickness of, e.g., from 50 to 500 Å can be formed on the protection layer 18, epitaxial layer 15, and the semiconductor substrate 11.

As described above, in a preferred embodiment of the present MOS transistor, since the impurity implanted regions are formed in 3 different concentrations (that is, the very low impurity concentration region 19, the low impurity concentration impurity region 13, and the high concentration source/drain region 22), the LDD effect further increases. In other words, unlike many conventional MOS transistors which protect against leakage current generated when the carriers move from the source to the drain at a voltage lower than the driving or operational voltage, and which may stabilize the driving voltage, by forming two different concentration impurity regions (according to the so-called "LDD effect"), the preferred MOS transistor according to the present invention has 3 different concentration impurity regions so as to further improve the LDD effect.

The method for fabricating the above structured MOS transistor will be described hereinafter.

Figure 1A:
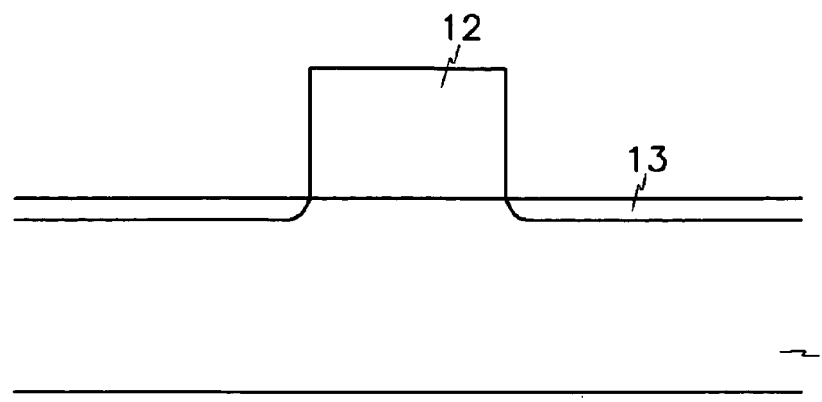
FIG. 1A to FIG. 1D are cross sectional views of a wafer for illustrating a MOS transistor fabrication method according to a preferred embodiment of the present invention.

As shown in FIG. 1A, a photoresist is deposited on the semiconductor substrate 11 and is patterned by a typical photolithography process, such that a photoresist pattern 12 is formed on the semiconductor substrate 11 at a predetermined CD. Next, the impurity ions are implanted into the semiconductor substrate 11 using the photoresist pattern 12 as a mask at a low concentration so as to form low concentration impurity regions 13. The low concentration impurity regions 13 are formed to have an impurity concentration within levels of low concentration impurity regions in conventional LDD structures. For example, impurity regions 13 may have an impurity concentration of from $5 \times 10^{-15}$ to $5 \times 10^{-17}$ atoms/cm$^2$. In one embodiment, the photoresist pattern 12 is removed after forming the low impurity concentration region 13.

Figure 1B:
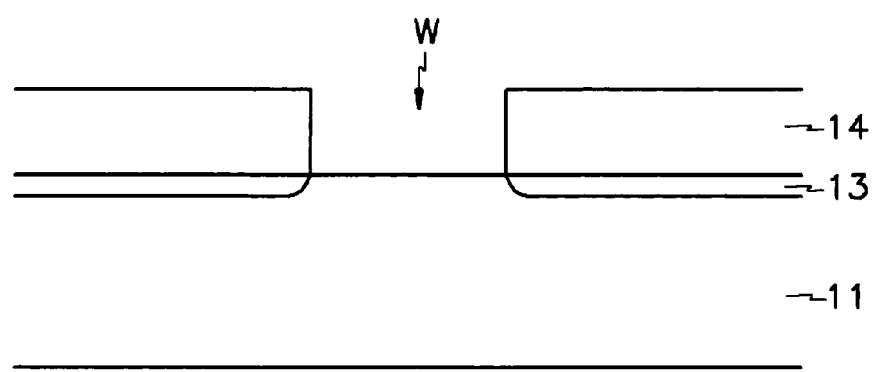

Sequentially, as shown in FIG. 1B, a sacrificial layer 14 is deposited on the entire surface of the semiconductor substrate 11, and portions thereof are selectively etched so as to form a window (W) through which the semiconductor substrate 11 is exposed between the low impurity concentration region 13. Preferably, the sacrificial layer 14 is formed from a nitride layer (e.g., silicon nitride or silicon oxynitride, but more preferably silicon nitride) having a thickness in the range of 100–1000 Å.

Figure 1C:
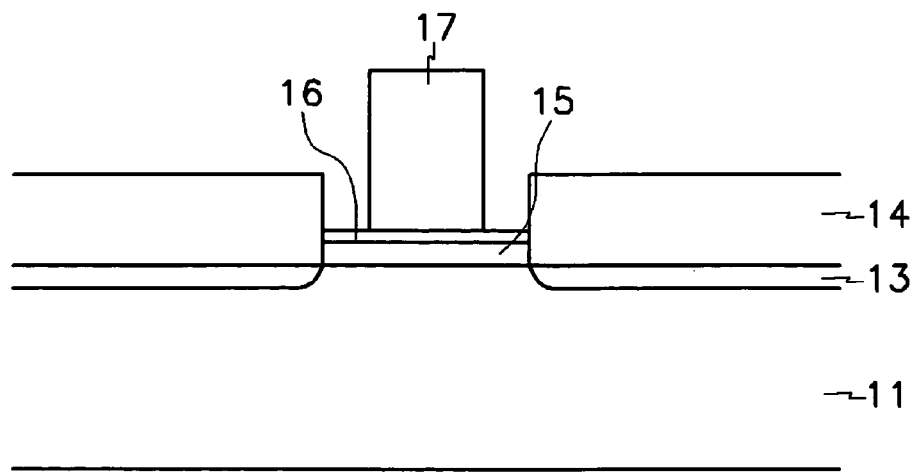

Next, as shown in FIG. 1C, an epitaxial layer 15 is formed on the semiconductor substrate 11 inside the window (W). When a silicon wafer is used as the semiconductor substrate, the epitaxial layer is preferably formed by epitaxially growing a silicon film. The silicon in the epitaxial silicon film is a material identical to the semiconductor, and as a result, the epitaxial silicon film can be grown selectively on the exposed silicon semiconductor substrate surface. The epitaxial layer is generally formed at a thickness in the range of 100–500 Å.

After forming the gate oxide layer 16 on the epitaxial layer 15, a gate 17 is formed on the gate oxide layer, a width of the gate being narrower than that of the epitaxial layer 15. The gate 17 can be formed by depositing a polycrystalline silicon layer on the surface of the sacrifice layer 14 including the gate oxide layer 16 at a thickness corresponding to a predetermined gate height, and then selectively etching the polycrystalline silicon layer using conventional photolithography.

Figure 1D:
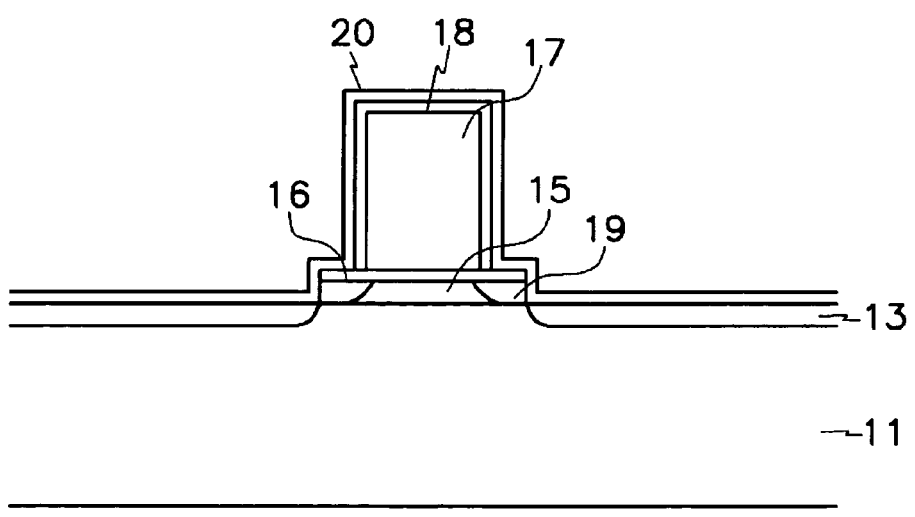

Sequentially, as shown in FIG. 1D, the very low concentration impurity region 19 is formed in an exposed portion of the epitaxial layer 15 by injecting impurity ions using the gate as a mask. At this time, the concentration of the impurity is adjusted so as to be lower than that of the low impurity concentration region. For example, regions 19 may have an impurity concentration of from $10^{-13}$ to less than $5 \times 10^{-15}$ atoms/cm$^2$. Before injecting the impurity ion for forming the very low impurity concentration region, a protection layer 18, such as an oxide layer, can be formed on the gate 17 for the purpose of protecting the gate 17 from damage during the ion injection process. Typically, protection layer 18 is formed by conventional wet or dry oxidation of the polysilicon gate material.

Sequentially, a cap oxide layer 20 is formed on the entire surface of the semiconductor substrate 11 including the protection layer 18 and the gate oxide layer 16, after removing the sacrifice layer 14. Typically, the cap oxide layer 20 is formed by CVD (e.g., PECVD or HDPCVD) from a silicon source such as TEOS or silane, and an oxygen source such as $O_2$ and/or $O_3$.

Next, as shown in FIG. 2, spacers 21 are formed on the sidewalls of the gate 17 and epitaxial layer 15. The spacers 21 are formed by depositing a nitride layer on the entire surface of the cap oxide layer 20 and then isotropically etching the nitride layer, until the cap oxide layer 20 on the upper surface of the gate 17 is exposed, only leaving the portions beside the gate 17 and epitaxial layer 15.

Sequentially, the source/drain region 22 is formed by injecting impurity ions into the semiconductor substrate 11 at a high concentration using the spacers 21 and the gate 17 as a mask. For example, source/drain regions 22 may have an impurity concentration of from $10^{-18}$ to $5 \times 10^{-21}$ atoms/cm$^2$. In this manner, the present MOS transistor is fabricated.

As described above, in the present invention, LDD region(s) comprising or consisting of very low concentration impurity region(s) 19 and low concentration impurity region(s) 13 maximize the LDD effect such that it is possible to significantly reduce or prevent leakage current and to improve the reliability of the device. Accordingly, it may also be possible to secure a large process margin by protecting against the generation of the leakage current and adjusting the off current. Also, using the present invention, it is possible to implement a very stable device having a gate width identical to those of conventional devices.

What is claimed is:

1. A method for fabricating a MOS transistor comprising the steps of:
   a) forming low concentration impurity regions in a semiconductor substrate;
   b) sequentially forming an epitaxial layer and gate oxide layer on the semiconductor substrate;
   c) forming a gate on said gate oxide layer, between the low concentration impurity regions, with a CD narrower than that between the low concentration impurity regions;
   d) forming very low concentration impurity regions in the epitaxial layer using the gate as a mask;
   e) forming spacers adjacent to the gate and the epitaxial layer; and
   f) forming source/drain regions in the semiconductor substrate using the spacer as a mask.

2. The method of claim 1, wherein the step of forming low concentration impurity regions includes:
   a-1) forming a pattern on the semiconductor substrate;
   a-2) injecting an impurity into the semiconductor substrate in low concentration using the pattern as a mask; and
   a-3) removing the pattern.

3. The method of claim 2, wherein the pattern is formed from a photoresist.

4. The method of claim 1, wherein the step of sequentially forming the epitaxial layer and the gate oxide layer includes:
   b-1) forming a sacrificial layer on the semiconductor substrate;
   b-2) forming a window in the sacrificial layer, exposing the semiconductor substrate between the low concentration impurity regions; and
   b-3) sequentially forming an epitaxial layer on the exposed semiconductor substrate and a gate oxide layer on the epitaxial layer.

5. The method of claim 4, further comprising removing the sacrificial layer after forming the very low concentration impurity regions.

6. The method of claim 4, wherein forming said window comprises selectively etching the sacrificial layer.

7. The method of claim 4, wherein the sacrificial layer comprises a nitride layer.

8. The method of claim 4, wherein the nitride layer has a thickness in the range of 100–1000 Å.

9. The method of claim 3, wherein the epitaxial layer has a thickness in the range of 100–500 Å.

10. The method of claim 1, wherein the step of forming the very low concentration impurity region comprises injecting or implanting impurity ions into said epitaxial layer at a very low concentration.

11. The method of claim 10, further including forming a protection layer on the gate before injecting or implanting said impurity ions into said epitaxial layer.

12. The method of claim 1, wherein the step of forming the source/drain regions comprises injecting or implanting impurity ions into said semiconductor substrate at a concentration higher than that of said low concentration impurity regions.

13. The method of claim 1, further comprising a step of forming a cap oxide layer on an entire surface of the semiconductor substrate including the gate before forming the spacer.

\* \* \* \* \*